(12) United States Patent
Martinez, Jr. et al.

(10) Patent No.: US 7,421,637 B1
(45) Date of Patent: Sep. 2, 2008

(54) GENERATING TEST INPUT FOR A CIRCUIT

(75) Inventors: Marvin W. Martinez, Jr., Plano, TX (US); David B. Erickson, Plano, TX (US)

(73) Assignee: Cisco Technology, Inc., San Jose, CA (US)

( * ) Notice: Subject to any disclaimer, the term of this patent is extended or adjusted under 35 U.S.C. 154(b) by 281 days.

(21) Appl. No.: 10/346,353

(22) Filed: Jan. 16, 2003

(51) Int. Cl.
*G01R 31/28* (2006.01)
(52) U.S. Cl. .................................... 714/739
(58) Field of Classification Search ................. 714/729, 714/738, 739
See application file for complete search history.

(56) References Cited

U.S. PATENT DOCUMENTS

| | | | | |
|---|---|---|---|---|
| 4,771,429 A | * | 9/1988 | Davis et al. ................. | 714/739 |
| 5,258,936 A | * | 11/1993 | Gallup et al. ............... | 708/254 |
| 5,369,648 A | * | 11/1994 | Nelson ........................ | 714/739 |
| 5,383,143 A | * | 1/1995 | Crouch et al. .............. | 708/254 |
| 5,416,783 A | * | 5/1995 | Broseghini et al. .......... | 714/728 |
| 5,610,926 A | * | 3/1997 | Marris ........................ | 714/726 |
| 5,619,512 A | * | 4/1997 | Kawashima et al. ........ | 714/733 |
| 5,787,094 A | | 7/1998 | Cecchi et al. ................. | 371/53 |
| 6,393,594 B1 | * | 5/2002 | Anderson et al. ........... | 714/738 |
| 6,438,722 B1 | * | 8/2002 | Bailey et al. ................ | 714/736 |
| 6,530,057 B1 | * | 3/2003 | Kimmitt ..................... | 714/758 |
| 6,701,476 B2 | * | 3/2004 | Pouya et al. ................ | 714/727 |
| 6,766,493 B1 | * | 7/2004 | Hoffman et al. ............ | 714/785 |
| 6,807,646 B1 | * | 10/2004 | Williams et al. ............ | 714/736 |
| 7,197,681 B2 | * | 3/2007 | Dervisoglu et al. ......... | 714/726 |

OTHER PUBLICATIONS

Kagaris, Tragoudas, Generating Deterministic Unordered Test Patterns with Counters, 1996, IEEE, 14th VLSI Test Symposium, pga 374-379.*

C. Barnhart et al., "OPMISR: The Foundation for Compressed ATPG Vectors," IEEE ITC International Test Confen:nce, Paper 27.4, pp. 748-757, Oct. 30-Nov. 1, 2001.*

* cited by examiner

*Primary Examiner*—Cynthia Britt
(74) *Attorney, Agent, or Firm*—Baker Botts L.L.P.

(57) ABSTRACT

Generating test input includes initializing a current pseudo-random value at a test input generator coupled to a circuit component. Write data is received from the circuit component. The following are repeated to generate next pseudo-random values as test input. The current pseudo-random value and the write data are retrieved. A next pseudo-random value is generated from the current pseudo-random value and the write data according to a generation function. The next pseudo-random value is transferred to the circuit component as the test input.

23 Claims, 2 Drawing Sheets

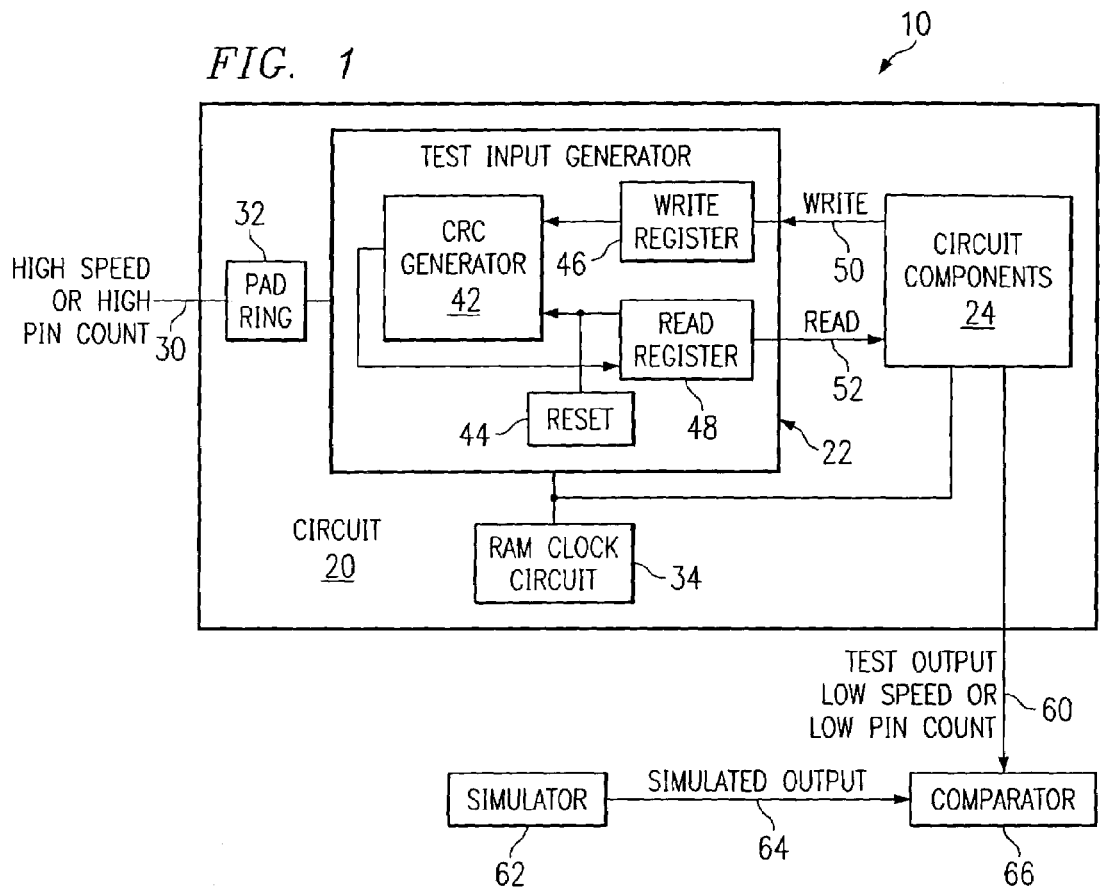
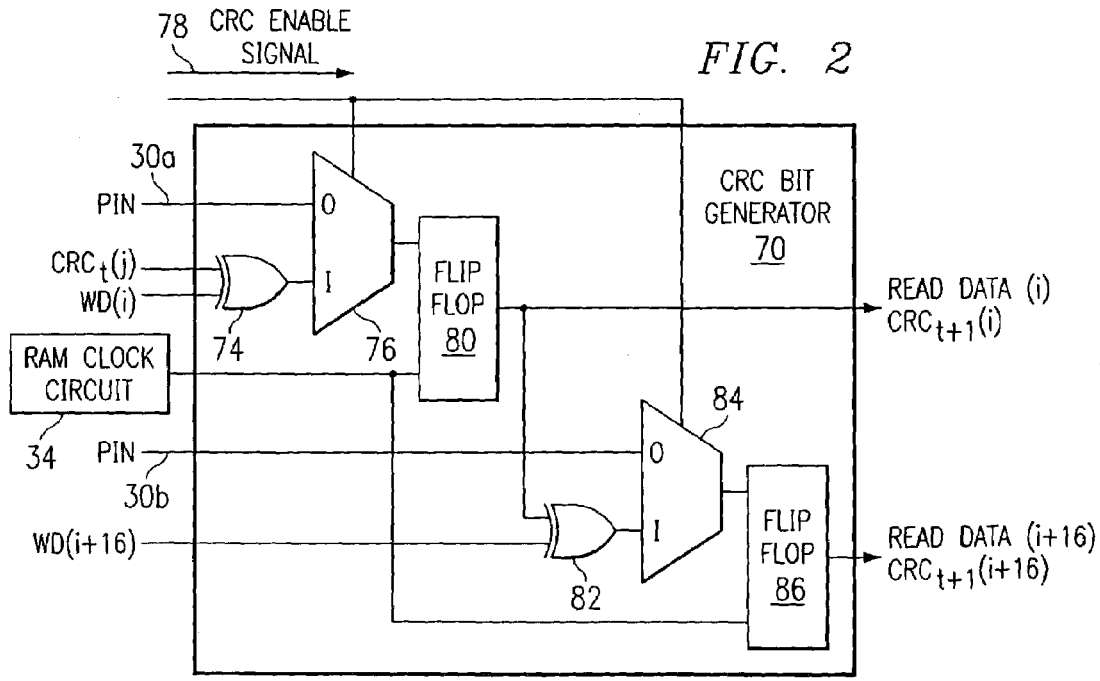

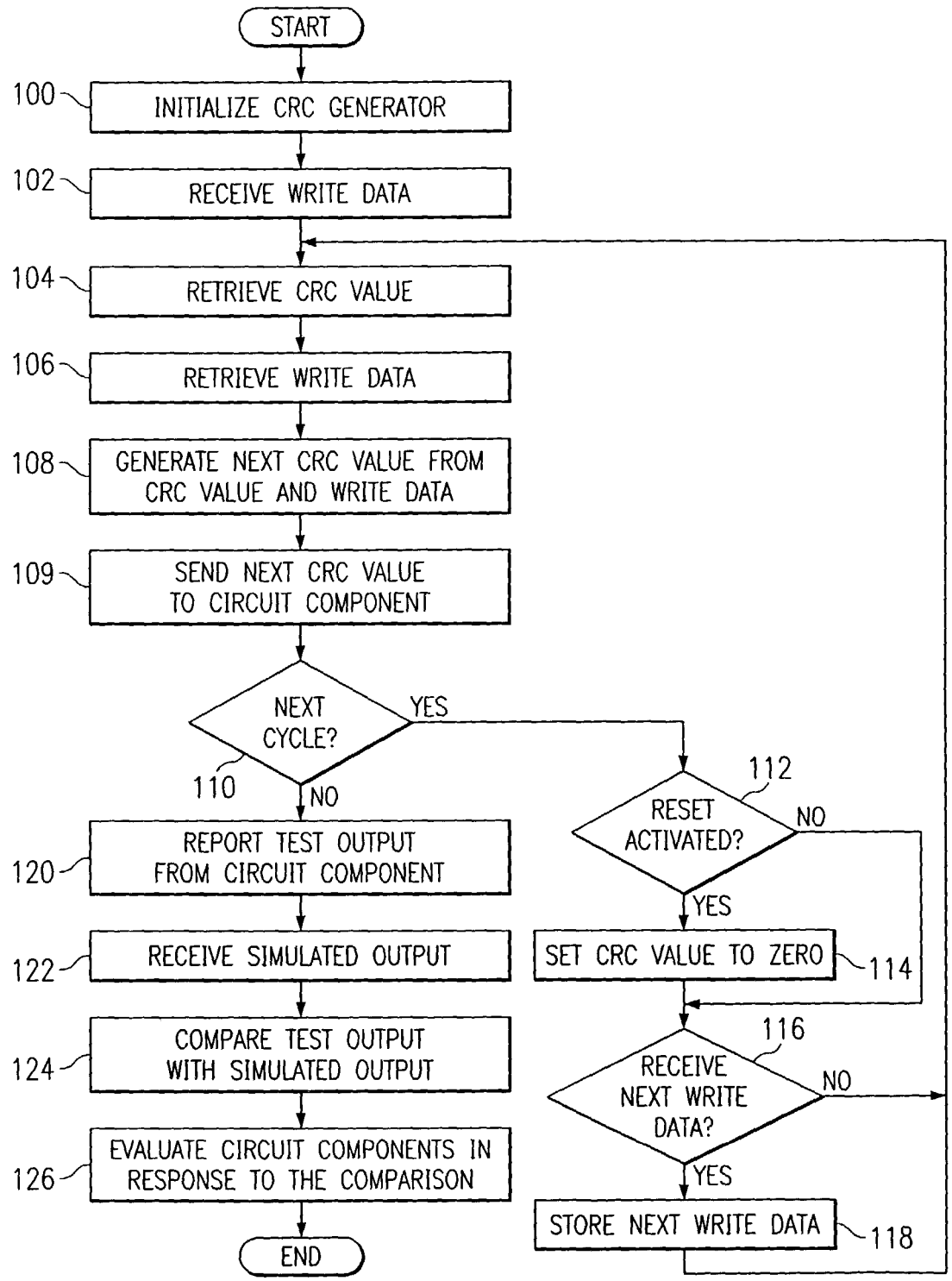

GENERATING TEST INPUT FOR A CIRCUIT

TECHNICAL FIELD OF THE INVENTION

This invention relates generally to the field testing digital electronic circuits and more specifically to generating test input for a circuit.

BACKGROUND OF THE INVENTION

Circuits are tested in order to detect defects of the circuits. Some circuit testers, however, are not sufficiently fast or wide to test high speed circuit components. Consequently, testing circuits has posed challenges.

SUMMARY OF THE INVENTION

In accordance with the present invention, disadvantages and problems associated with previous techniques for testing digital electronic circuits may be reduced or eliminated.

According to one embodiment of the present invention, generating test input includes initializing a current pseudo-random value at a test input generator coupled to a circuit component. Write data is received from the circuit component. The following are repeated to generate next pseudo-random values as test input. The current pseudo-random value and the write data are retrieved. A next pseudo-random value is generated from the current pseudo-random value and the write data according to a generation function. The next pseudo-random value is transferred to the circuit component as the test input.

Certain embodiments of the invention may provide one or more technical advantages. A technical advantage of one embodiment may be that a test input generator may generate test input for circuit components using data received from the circuit components. The test input generator may provide high speed predictably pseudo-random test input to the circuit components.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which:

FIG. 1 is a block diagram of one embodiment of a system for testing a circuit;

FIG. 2 is a block diagram illustrating one embodiment of a CRC bit generator of the CRC generator of FIG. 1; and FIG. 3 is a flowchart illustrating one embodiment of a method for generating test input for a circuit.

DETAILED DESCRIPTION OF THE DRAWINGS

Embodiments of the present invention and its advantages are best understood by referring to FIGS. 1 through 3 of the drawings, like numerals being used for like and corresponding parts of the various drawings.

FIG. 1 is a block diagram of one embodiment of a system 10 for testing a circuit 20. In general, circuit 20 includes a test input generator 22 that generates test input for one or more circuit components 24 of circuit 20 by generating a cyclic redundancy check (CRC) value using data received from circuit components 24.

According to the embodiment, circuit 20 includes one or more pins 30. Pins 30 may be used to couple an external tester to circuit 20 to test circuit 20. Typically, however, an external tester may not be able to run at a sufficiently high speed to test circuit 20. Test input generator 22 may provide test input of a higher speed than the speed of test input provided by an external tester. Pins 30 are coupled to a pad ring 32. A random access memory (RAM) clock circuit 34 supplies a RAM clock signal to test input generator 22 and circuit components 24. The RAM clock signal may have a frequency of, for example, approximately 0 to 600 MHz.

Test input generator 22 generates predictably pseudo-random output that may be used as test input to generate test patterns for circuit components 24. According to one embodiment, the pseudo-random output comprises pseudo-random values that include CRC values. The test input is generated using data received from circuit components 24. Test input generator 22 includes a write register 46, a read register 48, a cyclic redundancy check (CRC) generator 42, and a reset circuit 44. Write register 46 stores write data received from circuit components 24. Read register 48 stores a read value comprising a CRC value received from CRC generator 42. CRC generator 42 generates a CRC value from write data stored in write register and a CRC value stored in read register 48. CRC generator 42 is described in more detail with reference to FIG. 2.

Reset circuit 44 may be programmed to send a zero value to CRC function circuit 42. According to one embodiment, if CRC function circuit 42 receives a zero value, it yields a function output that results in a zero CRC value until write data is received from write register 46. Once write data is received, non-zero CRC values may be generated.

A write bus 50 transfers write data from circuit components 24 to test input generator 22. A read bus 52 transfers a CRC value from test input generator 22 to circuit components 24. The CRC value is used to provide test input to test circuit components 24.

Circuit components 24 may include one or more components that receive test input from test input generator 22 and generate a test output 60. Circuit components 24 may include, for example, a computational random access memory (CRAM), a processor, or any logic comprising any suitable combination of hardware and/or software that produces and expects values. Test output 60 comprises data generated by circuit components 24 in response to the test input received from test input generator 22.

A simulator 62 provides simulated output 64 that simulates test output 60 of a desired circuit component 24, such as a circuit component 24 free from defects. Simulator 62 may comprise, for example, a Verilog simulator. A comparator 66 compares test output 60 with simulated output 64. Ideally, test output 60 matches simulated output 64.

FIG. 2 is a block diagram illustrating one embodiment of a CRC bit generator 70 of CRC generator 42. A CRC value $CRC_{t+1}$ at time t+1 may be calculated from CRC value $CRC_t$ at time t stored at read register 48 and from write data WD stored at write register 46 using a generation function. According to one example, CRC bit generator 70 may be used to generate a 32-bit CRC value at time according to a generation function defined by Equation (1):

$$CRC_{t+1} = \begin{cases} CRC_t(j)XORWD(i), j = i+21, \text{ if } i \in \{0, 8\} \\ CRC_t(j)XORWD(i), j = i+15, \text{ if } i \in \{1, \ldots, 4, 6, 7, 9, \ldots 12, 14\} \\ CRC_t(j)XORWD(i)XORCRC_t(i+13), j = i+15, \text{ if } i \in \{5, 13\} \\ CRC_t(j)XORWD(i), j = i+16, \text{ if } i \in \{15, \ldots 31\} \end{cases} \quad (1)$$

where $CRC_t(i)$ is the ith bit of CRC value $CRC_t$, and $WD(i)$ is the ith bit of write data WD.

The generation function defined by Equation (1) may be expressed as Equations (2):

$$CRC_{t+1}(00) = CRC_t(21)XORWD(00)$$

$$CRC_{t+1}(01) = CRC_t(16)XORWD(01)$$

$$CRC_{t+1}(02) = CRC_t(17)XORWD(02)$$

$$CRC_{t+1}(03) = CRC_t(18)XORWD(03)$$

$$CRC_{t+1}(04) = CRC_t(19)XORWD(04)$$

$$CRC_{t+1}(05) = CRC_t(20)XORWD(05)XORCRC_t(18)$$

$$CRC_{t+1}(06) = CRC_t(21)XORWD(06)$$

$$CRC_{t+1}(07) = CRC_t(22)XORWD(07)$$

$$CRC_{t+1}(08) = CRC_t(29)XORWD(08)$$

$$CRC_{t+1}(09) = CRC_t(24)XORWD(09)$$

$$CRC_{t+1}(10) = CRC_t(25)XORWD(10)$$

$$CRC_{t+1}(11) = CRC_t(26)XORWD(11)$$

$$CRC_{t+1}(12) = CRC_t(27)XORWD(12)$$

$$CRC_{t+1}(13) = CRC_t(28)XORWD(12)XORCRC_t(26)$$

$$CRC_{t+1}(14) = CRC_t(29)XORWD(14)$$

$$CRC_{t+1}(15) = CRC_t(31)XORWD(15)$$

$$CRC_{t+1}(16) = CRC_t(00)XORWD(16)$$

$$CRC_{t+1}(17) = CRC_t(01)XORWD(17)$$

$$CRC_{t+1}(18) = CRC_t(02)XORWD(18)$$

$$CRC_{t+1}(19) = CRC_t(03)XORWD(19)$$

$$CRC_{t+1}(20) = CRC_t(04)XORWD(20)$$

$$CRC_{t+1}(21) = CRC_t(05)XORWD(21)$$

$$CRC_{t+1}(22) = CRC_t(06)XORWD(22)$$

$$CRC_{t+1}(23) = CRC_t(07)XORWD(23)$$

$$CRC_{t+1}(24) = CRC_t(08)XORWD(24)$$

$$CRC_{t+1}(25) = CRC_t(09)XORWD(25)$$

$$CRC_{t+1}(26) = CRC_t(10)XORWD(26)$$

$$CRC_{t+1}(27) = CRC_t(11)XORWD(27)$$

$$CRC_{t+1}(28) = CRC_t(12)XORWD(28)$$

$$CRC_{t+1}(29) = CRC_t(13)XORWD(29)$$

$$CRC_{t+1}(30) = CRC_t(14)XORWD(30)$$

$$CRC_{t+1}(31) = CRC_t(15)XORWD(31) \quad (2)$$

The generation function may, however, comprise any suitable function. For example, the generation function may comprise a function of the current pseudo-random value, a reset value, the write data, and one or more non-data control signals According to one embodiment, CRC bit generator 70 includes an XOR gate 74. XOR gate 74 performs an XOR operation on CRC bit value $CRC_t(j)$ received from read register 48 and write data WD(i) received from write register 46. A multiplexer 76 transmits information from either pin 30*a* or XOR gate 74 in accordance with a CRC enable signal 78. If CRC enable signal 78 indicates that a CRC bit value is to be calculated, multiplexer 76 transmits a signal from XOR gate 74. If CRC enable signal indicates that a CRC bit value is not to be calculated, multiplexer 76 transmits the signal from pin 30*a*. A flip-flop circuit 80 receives previous CRC write data from multiplexer 76. The previous CRC write data is used to generate a next $CRC_{t+1}(i)$ bit value.

An XOR gate 82 performs an XOR operation on next CRC bit value $CRC_{t+1}(i)$ from flip-flop 80 and write data WD(i+16) from write registers 46. A multiplexer 84 transmits values from either pin 30*b* or XOR gate 30 in accordance with CRC enable signal 78. If CRC enable signal 78 indicates that a CRC bit value is to be computed, multiplexer 84 transmits the value from XOR gate 82. If CRC enable signal 78 indicates that a CRC bit value is not to be determined, multiplexer 84 transmits the value from pin 30*b*. A flip-flop 86 receives the value from multiplexer 84 and RAM clock circuit 34 and generates a next CRC bit value $CRC_{t+1}$ (i+16).

According to one embodiment, CRC bit generator 70 determines the CRC bit values according to Equation (2). To calculate CRC bit i∈{0,8} according to Expression (3):

$$CRC_t(j)XORWD(i) \quad (3)$$

XOR gate 74 performs an XOR operation on CRC bit value $CRC_t(j)$, where j=i+21, and write data WD(i).

To calculate CRC bit value i∈{1, . . . 4, 6, 7, 9, . . . , 12, 14} according to Expression (4):

$$CRC_t(j)XORWD(i) \quad (4)$$

XOR gate 74 performs an XOR operation on CRC bit value $CRC_t(j)$, where j=i+15, and write data WD(i).

To calculate CRC bit value i∈{5,13} according to Expression (5):

$$CRC_t(j)XORWD(i)XORCRC(i+13) \quad (5)$$

XOR gate 74 receives CRC bit value $CRC_t(j)$ that is the result of an XOR operation performed on CRC bit values $CRC_t(i+15)$ and $CRC_t(i+13)$ by a previous CRC bit generator 70. XOR gate 74 performs an XOR operation on the result and write data WD(i).

To compute CRC bit value i∈{15, . . . , 31} according to Expression (6):

$$CRC_t(i+16)XORWD(i) \quad (6)$$

XOR gate 82 performs an XOR operation on CRC bit value $CRC_{t+1}(i)$ and write data WD(i+16) to compute CRC bit value $CRC_{t+1}(i+16)$.

FIG. 3 is a flowchart illustrating one embodiment of a method for generating test input for circuit 20. The method begins at step 100, where CRC generator 42 is initialized.

Reset circuit 44 may be used to initialize CRC generator 42. Write data is received from circuit components 24 by write register 46 at step 102.

A current CRC value is retrieved from read register 48 at step 104. The write data is retrieved from write register 46 at step 106. At step 108, CRC generator 42 generates a next CRC value from the write data and the current CRC value. The next CRC value is sent to circuit components 24 at step 109.

If there is a next cycle at step 110, the method proceeds to step 112 to determine if a reset has been activated. If a reset has been activated, the method proceeds to step 114, where the CRC value is set to zero, and then proceeds to step 116. If a reset has not been activated, the method proceeds directly to step 116 to determine whether next write data has been received from circuit components 24. If next write data has been received, the method proceeds to step 118, where write register 46 stores the next write data. After the next write data is stored, the method returns to step 104. If next write data has not been received at step 116, the method returns directly to step 104, where the CRC value is retrieved.

If there is no next cycle at step 110, the method proceeds to step 120, where test output 60 from circuit components 24 is reported. Test output 60 may be reported substantially simultaneously as CRC values are generated at step 108. Simulated output 64 is received at comparator 66 at step 122. Comparator 66 compares test output 60 and simulated output 64 at step 124. Circuit components 24 are evaluated in response to the comparison at step 126. After evaluating circuit components 24, the method terminates. Some of the steps may be omitted or others added without departing from the scope of the invention.

Certain embodiments of the invention may provide one or more technical advantages. A technical advantage of one embodiment may be that a test input generator may generate test input for circuit components using data received from the circuit components. The test input generator may provide high speed predictably pseudo-random test input to the circuit components.

Although an embodiment of the invention and its advantages are described in detail, a person skilled in the art could make various alterations, additions, and omissions without departing from the spirit and scope of the present invention as defined by the appended claims.

What is claimed is:

1. A method for generating test input, comprising:
   initializing a current pseudo-random value at a test input generator; and
   using the test input generator to generate a plurality of test inputs by repeating the following:
      transferring the current pseudo-random value as test input to a circuit component under test;
      receiving write data generated by the circuit component under test in response to the current pseudo-random value;
      generating, according to a generation function, a next pseudo-random value from the current pseudo-random value and the write data; and
      assigning the next pseudo-random value to be the current pseudo-random value;
   detecting a reset signal; and
   setting the current pseudo-random value to a preset seed value in response to the reset signal.

2. The method of claim 1, wherein:
   the current pseudo-random value comprises a current cyclic redundancy check value; and
   the next pseudo-random value comprises a next cyclic redundancy check value.

3. The method of claim 1, wherein the current pseudo-random value comprises one or more current pseudo-random value bits and the write data comprises one or more write data bits; and
   wherein generating a next pseudo-random value from the current pseudo-random value and the write data according to a generation function comprises performing an exclusive-or operation on each current pseudo-random value bit and an associated one of the write data bits.

4. The method of claim 1, further comprising:
   receiving new write data;
   generating, according to the generation function, the next pseudo-random value from the current pseudo-random value and the new write data; and
   transferring the next pseudo-random value to the circuit component as test input.

5. The method of claim 1, further comprising receiving test output from the circuit component generated in response to the next pseudo-random values.

6. The method of claim 1, further comprising:
   receiving test output from the circuit component generated in response to the next pseudo-random values;
   receiving simulated output; and
   comparing the test output and the simulated output.

7. The method of claim 1, wherein the generation function comprises a function of the current pseudo-random value, a reset value, the write data, and one or more non-data control signals.

8. A system for generating test input, comprising:
   a first register operable to store a current pseudo-random value;
   a second register operable to receive write data from a circuit component; and
   a test input generator coupled to the first register, the second register, and the circuit component, the test input generator operable to:
      repeat the following to generate a plurality of test inputs:
         transfer the current pseudo-random value as test input to a circuit component under test;
         receive write data generated by the circuit component under test in response to the current pseudo-random value;
         generate, according to a generation function, a next pseudo-random value from the current pseudo-random value and the write data; and
         assign the next pseudo-random value to be the current pseudo-random value;
      detect a reset signal; and
      set the current pseudo-random value to a preset seed value in response to the reset signal.

9. The system of claim 8, wherein:
   the current pseudo-random value comprises a current cyclic redundancy check value; and
   the next pseudo-random value comprises a next cyclic redundancy check value.

10. The system of claim 8, wherein the current pseudo-random value comprises one or more current pseudo-random value bits and the write data comprises one or more write data bits; and
    wherein the test input generator is operable to generate a next pseudo-random value from the current pseudo-random value and the write data according to a generation function by performing an exclusive-or operation on each current pseudo-random value bit and an associated one of the write data bits.

11. The system of claim 8, wherein the test input generator is further operable to:
  receive new write data;
  generate, according to the generation function, the next pseudo-random value from the current pseudo-random value and the new write data; and
  transfer the next pseudo-random value to the circuit component as test input.

12. The system of claim 8, wherein the test input generator is further operable to receive test output from the circuit component generated in response to the next pseudo-random values.

13. The system of claim 8, wherein the test input generator is further operable to:
  receive test output from the circuit component generated in response to the next pseudo-random values;
  receive simulated output; and
  compare the test output and the simulated output.

14. The system of claim 8, wherein the generation function comprises a function of the current pseudo-random value, a reset value, the write data, and one or more non-data control signals.

15. Logic for generating test input, the logic embodied in a computer-readable medium and when executed by a computer operable to:
  initialize a current pseudo-random value at a test input generator; and
  use the test input generator to generate a plurality of test inputs by repeating the following:
    transfer the current pseudo-random value as test input to a circuit component under test;
    receive write data generated by the circuit component under test in response to the current pseudo-random value;
    generate, according to a generation function, a next pseudo-random value from the current pseudo-random value and the write data; and
    assign the next pseudo-random value to be the current pseudo-random value;
  detect a reset signal; and
  set the current pseudo-random value to a preset seed value in response to the reset signal.

16. The logic of claim 15, wherein:
  the current pseudo-random value comprises a current cyclic redundancy check value; and
  the next pseudo-random value comprises a next cyclic redundancy check value.

17. The logic of claim 15, wherein the current pseudo-random value comprises one or more current pseudo-random value bits and the write data comprises one or more write data bits; and
  wherein the logic is operable to generate a next pseudo-random value from the current pseudo-random value and the write data according to a generation function by performing an exclusive-or operation on each current pseudo-random value bit and an associated one of the write data bits.

18. The logic of claim 15, operable to:
  receive a reset signal; and
  set the current pseudo-random value to a preset seed value in response to the reset signal.

19. The logic of claim 15, operable to:
  receive new write data;
  generate, according to the generation function, the next pseudo-random value from the current pseudo-random value and the new write data; and
  transfer the next pseudo-random value to the circuit component as test input.

20. The logic of claim 15, operable to receive test output from the circuit component generated in response to the next pseudo-random values.

21. The logic of claim 15, operable to:
  receive test output from the circuit component generated in response to the next pseudo-random values;
  receive simulated output; and
  compare the test output and the simulated output.

22. The logic of claim 15, wherein the generation function comprises a function of the current pseudo-random value, a reset value, the write data, and one or more non-data control signals.

23. A system for generating test input, comprising:
  a first register operable to store a current pseudo-random value, the current pseudo-random value comprising one or more current pseudo-random value bits and a current cyclic redundancy check value;
  a second register operable to receive write data comprising one or more write data bits from a circuit component; and
  a test input generator coupled to the first register, the second register, and the circuit component, the test input generator operable to:
    repeat the following to generate a plurality of test inputs:
      receive the current pseudo-random value and receiving the write data generated by the circuit component in response to the current pseudo-random value;
      generate, according to a generation function, a next pseudo-random value comprising a next cyclic redundancy check value from the current pseudo-random value and the write data by performing an exclusive-or operation on each current pseudo-random value bit and an associated one of the write data bits; and
      assign the next pseudo-random value to be the current pseudo-random value;
    set the current pseudo-random value to zero in response to a reset signal;
    receive new write data;
    generate, according to the generation function, the next pseudo-random value from the current pseudo-random value and the new write data;
    transfer the next pseudo-random value as test input to the circuit component under test;
    receive test output from the circuit component under test generated in response to the next pseudo-random values;
    receive simulated output; and
    compare the test output and the simulated output.

\* \* \* \* \*